United States Patent
Woo et al.

(10) Patent No.: US 6,893,910 B1
(45) Date of Patent: May 17, 2005

(54) ONE STEP DEPOSITION METHOD FOR HIGH-K DIELECTRIC AND METAL GATE ELECTRODE

(75) Inventors: Christy Mei-Chu Woo, Cupertino, CA (US); Paul R. Besser, Sunnyvale, CA (US); Minh Van Ngo, Fremont, CA (US); James N. Pan, Fishkill, NY (US); Jinsong Yin, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/462,670

(22) Filed: Jun. 17, 2003

(51) Int. Cl.[7] ............... H01L 21/338; H01L 21/336; H01L 21/3205; H01L 21/31

(52) U.S. Cl. ............... 438/183; 438/287; 438/591; 438/785

(58) Field of Search ............... 438/183, 287, 438/785, 591

(56) References Cited

U.S. PATENT DOCUMENTS

| 5,960,270 | A | | 9/1999 | Misra et al. | |
|---|---|---|---|---|---|
| 6,140,167 | A | * | 10/2000 | Gardner et al. | 438/197 |
| 6,210,999 | B1 | * | 4/2001 | Gardner et al. | 438/183 |
| 6,410,376 | B1 | * | 6/2002 | Ng et al. | 438/199 |
| 6,620,664 | B2 | * | 9/2003 | Ma et al. | 438/183 |

OTHER PUBLICATIONS

Wolf et al. "Silicon Processing For The VLSI Era" 1996; vol. 1; p. 331, second paragraph.*

* cited by examiner

*Primary Examiner*—Michael Lebentritt
*Assistant Examiner*—Ron Pompey

(57) ABSTRACT

A method for forming a semiconductor structure removes the temporary gate formed on the dielectric layer to expose a recess in which oxygen-rich CVD oxide is deposited. A tantalum layer is then deposited by low-power physical vapor deposition on the CVD oxide. Annealing is then performed to create a $Ta_2O_5$ region and a Ta region from the deposited oxide and Ta. This creates a low carbon-content $Ta_2O_5$ and a metallic Ta gate in a single process step.

18 Claims, 4 Drawing Sheets

ONE STEP DEPOSITION METHOD FOR HIGH-K DIELECTRIC AND METAL GATE ELECTRODE

FIELD OF THE INVENTION

The present invention relates to semiconductor manufacturing technology, and more particularly, to the formation of a metal gate and high-k gate dielectric arrangement.

BACKGROUND OF THE INVENTION

Over the last few decades, the electronics industry has undergone a revolution by various efforts to decrease the size of device elements formed in integrated circuits (IC), and such efforts have contributed in increasing the density of circuit elements and device performance. A large variety of semiconductor devices have been manufactured having various applications in numerous disciplines.

Currently, the most common and important semiconductor technology presently used is silicon-based, and the most preferred silicon-based semiconductor device is a MOS (Metal Oxide Semiconductor) transistor. The principal elements of a typical MOS transistor generally comprise a semiconductor substrate on which a gate electrode is disposed. The gate electrode is typically a heavily doped conductor to which an input signal is typically applied via a gate terminal. Heavily doped active regions, e.g., source/drain regions, are formed in the semiconductor substrate and are connected to source/drain terminals. A channel region is formed in the semiconductor substrate beneath the gate electrode and separates the source/drain regions. The gate electrode is generally separated from the semiconductor substrate by a dielectric layer, e.g., an oxide layer, to prevent current from flowing between the gate electrode and the source/drain regions or channel regions.

Conventional process steps for fabricating a typical MOS transistor are depicted in FIGS. 1 to 8. First, as depicted in FIG. 1, an oxide layer is thermally grown on a semiconductor substrate 10, i.e., typically silicon, and a conductive layer, typically polysilicon, is formed over the oxide layer. The oxide layer and conductive layer are patterned and etched to form gate dielectric 12 and gate electrode 14, respectively. Then, as depicted in FIG. 2, impurity atoms, e.g., boron or phosphorus, are ion implanted into the surface of the silicon substrate 10, by utilizing the gate electrode 14 as a mask, to form shallow source/drain regions 16 on the main surface of the silicon substrate 10.

The ion implantation step is followed by an annealing step which normally involves a high temperature of 700° C. or higher to activate the implanted impurity atoms in the shallow source/drain regions 16 and to cure the damage caused by the physical impact to the crystal structure of the silicon substrate 10 when the impurity atoms are implanted thereto. Sidewall spacers 18 are then formed on the side surfaces of the gate dielectric 12 and gate electrode 14, as depicted in FIG. 3.

Subsequently, source/drain regions 20 are formed by ion implanting impurity atoms, e.g., boron or phosphorus, at an impurity implantation concentration and energy higher than those from the first annealing process, by utilizing the gate electrode 14 and the sidewall spacers 18 as a mask, as depicted in FIG. 4. Once again, the annealing process is performed at a high temperature of 700° C. or higher to activate the implanted impurity atoms in the source/drain regions 20 and to cure the damage caused by the implantation impact.

As transistor dimensions approached one micron in diameter, conventional parameters resulted in intolerably increased resistance between the active region 20 and conductive interconnect lines formed subsequently to interconnect various device elements in the integrated circuit device. The principle way of reducing such contact resistance is by forming a metal silicide atop the source/drain regions 20 and the gate electrodes 14 prior to application of the conductive film for formation of the various conductive interconnect lines. Common metal silicide materials are $CoSi_2$ and $TiSi_2$.

As depicted in FIG. 5, a metal layer 22 is typically provided by first applying a thin layer of, for example, titanium, atop the wafer which contacts the source/drain regions 20. Then, the wafer is subjected to one or more annealing steps at the temperature of 800° C. or higher. This causes the titanium layer 22 to selectively react with the silicon of the source/drain regions 20 and the gate electrodes 14, thereby forming a metal silicide ($TiSi_2$) layer 24 selectively on the source/drain regions 20 and the gate electrodes 14. Such a process is referred to as a salicide (self-aligned silicide) process because the $TiSi_2$ layer 24 is formed only where the titanium material directly contacts the silicon source/drain regions 20 and the polycrystalline silicon gate electrode 14. Following the formation of the silicide layer 24, as depicted in FIG. 7, an interlayer dielectric film 26 is deposited over the entire surface of the substrate 10, and an interconnect process is performed (not shown) to provide conductive paths by forming via holes through the interlayer dielectric 26 and filling the via holes with a conductive material, e.g., tungsten.

As the dimensions of the MOS transistor are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this problem, a high k (dielectric constant) gate dielectric, e.g., $ZrO_2$, $HfO_2$, $InO_2$, $LaO_2$, $TaO_2$, was introduced to replace the silicon oxide for submicron MOS devices. However, it has been also observed that the high k gate dielectric becomes thermally unstable during the high temperature process steps for fabrication of the MOS transistor. For example, as mentioned above, the source/drain region activation annealing steps in FIGS. 2 and 4 and the silicidation step in FIG. 6 are normally performed at a temperature of at least 700° C. or higher, or in some cases at a temperature of 1000° C. or higher. At such a high temperature, tantalum oxide ($Ta_2O_5$), another high k gate dielectric, is transformed from amorphous to crystalline, which causes charge carrier leakage. In addition, at such a high temperature, tantalum oxide undesirably interacts with the underlying silicon substrate or overlying polysilicon gate electrode of the MOS transistor.

To solve this problem, a metal gate electrode has been introduced to avoid the reaction between the high k gate dielectric and the polysilicon gate electrode during the high temperature processing steps. For example, as described in the U.S. Pat. No. 5,960,270 by Misra, et al. a metal deposition process was proposed to form a metal gate layer by depositing molybdenum, tungsten, tungsten silicide, nickel silicide, or titanium nitride. However, it his been also observed that the metal atoms from the gate electrode diffuse into the gate dielectric, thereby causing faster degradation of the high k gate dielectric, and both the high k gate dielectric and the metal gate electrode suffer structural stress from such high temperature process steps. Also, since the metal or metal silicide layer is deposited entirely over the semiconductor structure, it has been observed that it is difficult to controllably remove the unnecessary portions of the deposited metal or metal silicide layer to shape a metal or metal silicide gate due to the material unity.

In conventional methodology, the deposition of $Ta_2O_5$ is performed by MOCVD or ALD techniques. These processes have a number of disadvantages. The disadvantages include the creation of a $Ta_2O_5$ film with high carbon content. The precursor employed in the CVD process produces the high carbon content. There is a need for a method of creating a high dielectric film that overcomes these disadvantages.

SUMMARY OF THE INVENTION

These and other needs are met by embodiments of the present invention which provide a method of forming a semiconductor structure comprising the steps of forming a precursor having a substrate with active regions separated by a channel, and temporary gate over the channel and between the dielectric structures. The temporary gate is removed to form a recess with a bottom and sidewalls between the dielectric structures. Oxide is deposited within the recess. Tantalum is then deposited by physical vapor deposition on the oxide. Annealing is then performed to form a $Ta_2O_5$ region and a Ta region from the deposited oxide and Ta.

Some of the advantages of the present invention include the use of an existing PVD deposition technique to deposit tantalum, instead of using a chemical vapor deposition technique to technique deposit $Ta_2O_5$. The inventive technique, besides avoiding use of a new, costly CVD or ALD deposition tool, forms a cleaner and less carbon-containing high-k dielectric $Ta_2O_5$. Further, the $Ta_2O_5$ and Ta metal gate are formed in a combined process step, reducing manufacturing costs.

The earlier stated needs are also met by other embodiments of the present invention that provide a method of forming a metal gate and a gate dielectric of a semiconductor device, comprising the steps of forming an oxide within a damascene recess, and depositing Ta on the oxide. The Ta region is then reacted with the oxide to form $Ta_2O_5$ and Ta regions.

The foregoing and other features, aspects and advantages of the present invention will become more apparent from the following detailed description of the present invention when taken with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE INVENTION

The present invention addresses and solves problems related to the formation of a high-k gate dielectric and metal gate. In particular, the present invention addresses problems related to the conventional deposition of $Ta_2O_5$ by CVD or ALD techniques. In particular, the high carbon content inside a deposited $Ta_2O_5$ film is avoided by depositing an oxygen-rich CVD oxide within a damascene recess, followed by a PVD deposition of tantalum on the CVD oxide. A single annealing step is performed to react the lower part of the tantalum film with the oxygen-rich CVD oxide to form high-k $Ta_2O_5$, while the upper portion of the original Ta film remains metallic. The use of the PVD technique avoids the need for a new CVD or ALD deposition tool, which would be relatively costly. In addition, the high-k gate dielectric $Ta_2O_5$ is a cleaner and less carbon-containing material formed by MOCVD or ALD techniques.

The method steps described below do not form a complete process step for manufacturing integrated circuits. The present invention can be practiced in conjunction with integrated circuit fabrication techniques currently used in the art, and only so much of the commonly practiced process steps are included as are necessary for an understanding of the present invention. The Figures representing cross-section portions of a semiconductor chip or a substrate during fabrication are not drawn to scale, but instead are drawn to illustrate the features of the present invention.

Figure 1:
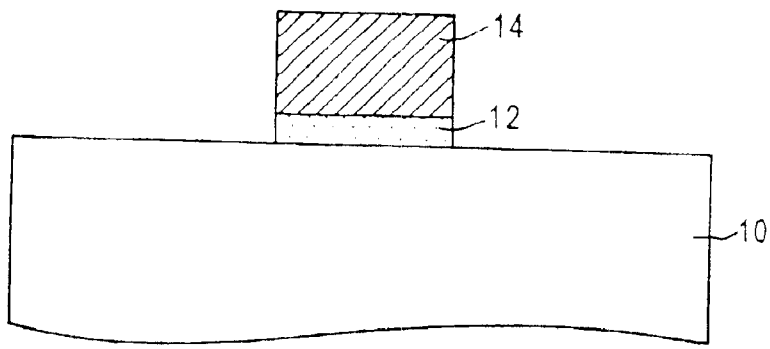
FIG. 1 is a schematic depiction of a cross-section of a prior art semiconductor structure, in which a gate electrode is formed on a semiconductor substrate with a gate oxide therebetween.
Figure 2:
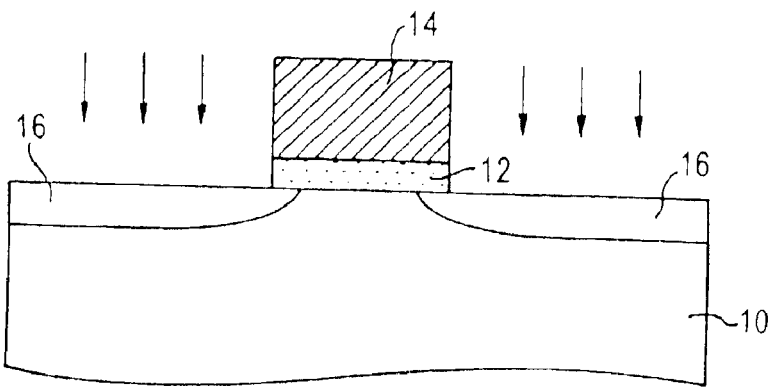
FIG. 2 depicts the portion of FIG. 1, during the first ion implantation process to form shallow source and drain regions on the main surface of the substrate.
Figure 3:
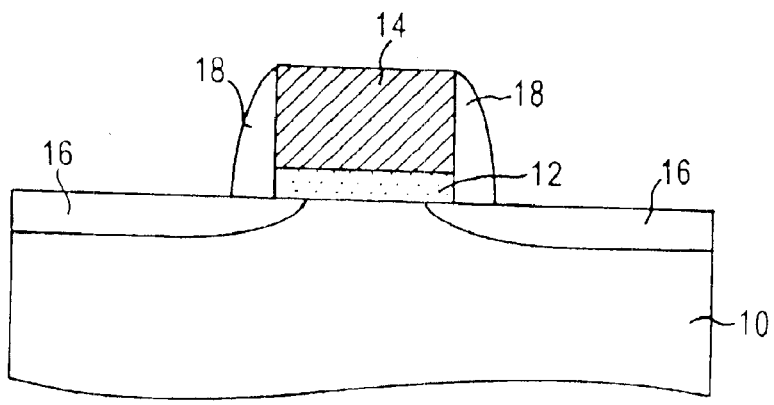
FIG. 3 depicts the portion of FIG. 2, after the first annealing process and a sidewall spacer formation process.
Figure 4:
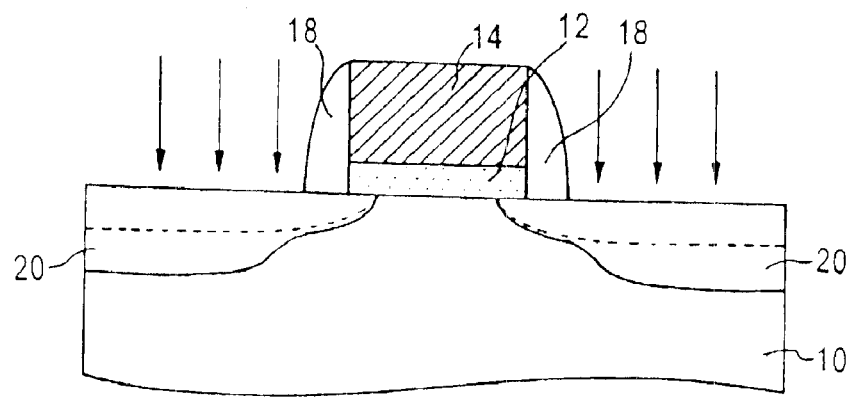
FIG. 4 depicts the portion of FIG. 3, during the second ion implantation process to form source and drain regions on the main surface of the substrate.
Figure 5:
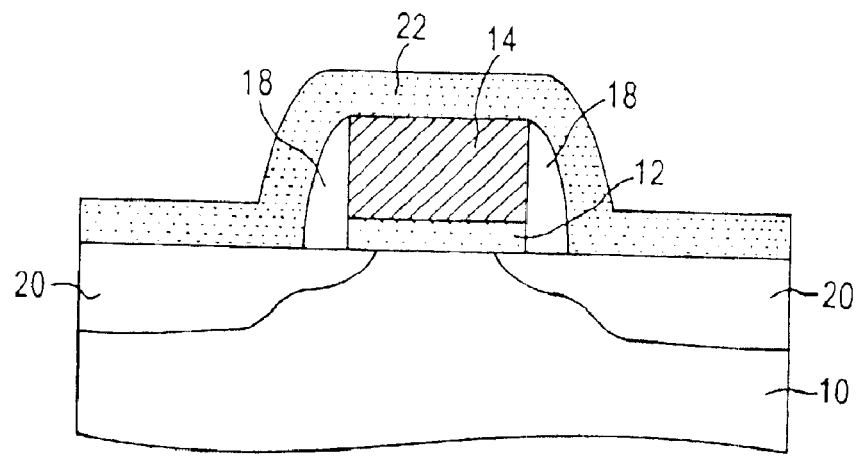
FIG. 5 depicts the portion of FIG. 4, after the second annealing process and a metal layer deposition process.
Figure 6:
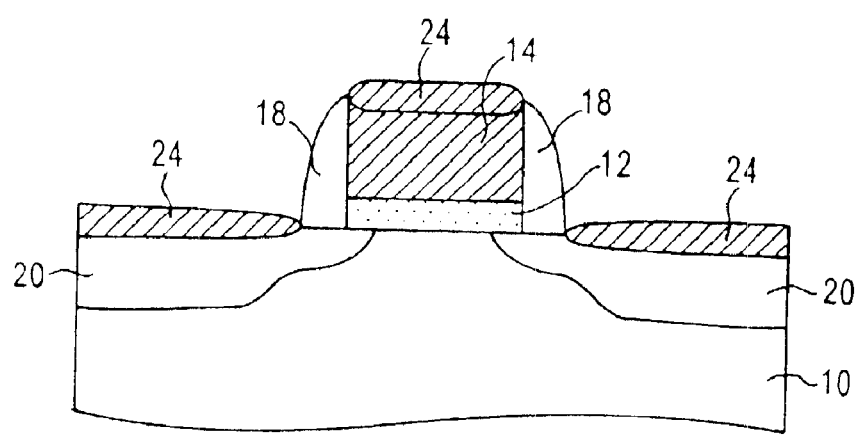
FIG. 6 depicts the portion of FIG. 5, after a silicidation process to torn a metal silicide layer on the source and drain regions and the gate electrode.
Figure 7:
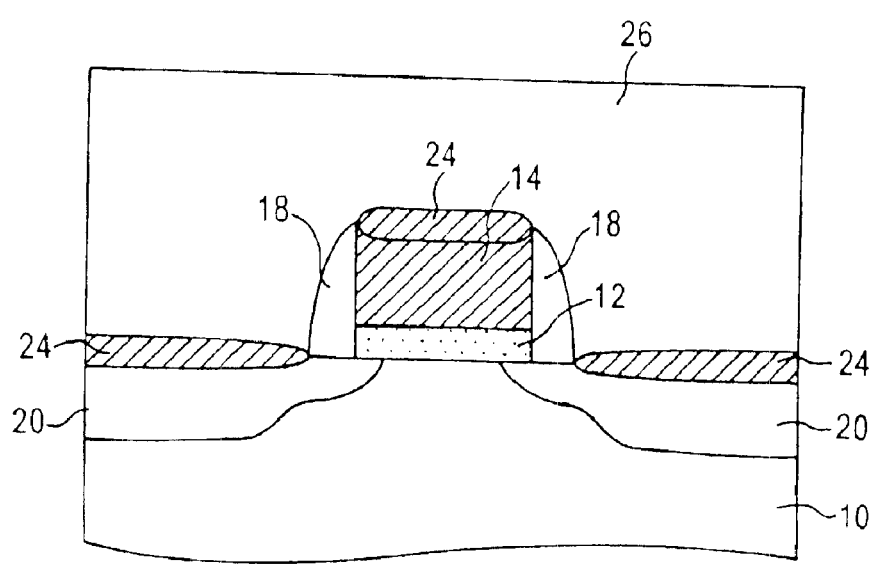
FIG. 7 depicts the portion of FIG. 6, after an interlayer dielectric layer formation.
Figure 8:
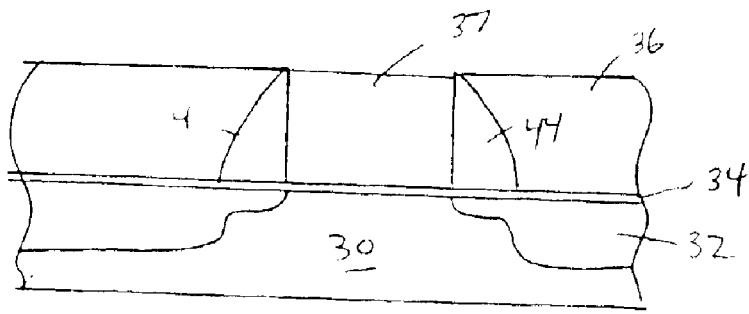
FIG. 8 is a schematic depiction of a cross-section of a semiconductor structure precursor in accordance with embodiments of the present invention.

With this in mind, FIG. 8 is a cross-section of a precursor for a semiconductor structure constructed in accordance with embodiments of the present invention. In FIG. 8, the silicon substrate 30 has active regions 32 formed therein by conventional ion implantation and subsequent annealing techniques. A silicide layer (not shown) may be formed atop the active regions 32 to reduce the resistance between the active regions 32 and conductive interconnect lines that will be subsequently formed.

A polysilicon gate 37, which serves as a temporary gate, is provided on the top of the channel and a very thin gate oxide layer 34. An exemplary thickness for the gate oxide layer 34 is between about 10 Å to about 50 Å, with a preferred thickness of about 14 Å. The gate oxide 34 may be formed by a conventional thermal process.

Sidewall spacers 44 are provided on the sidewalls of the gate 37, and an interlayer dielectric 36 is provided to cover the active regions 32.

Figure 9:
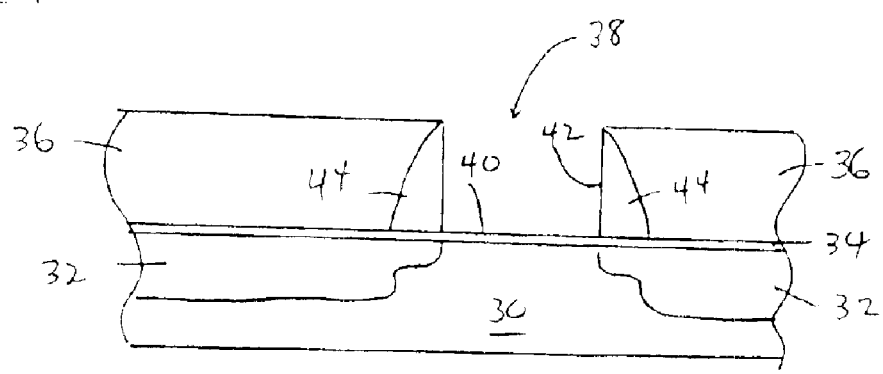
FIG. 9 depicts the portion of FIG. 8, after the temporary gate electrode has been removed to form a recess.

In FIG. 9, the temporary gate 37 is removed from the region between the sidewall spacers 44. A plasma reactive ion etch (RIL) using chlorine or a wet polysilicon etch using conventional etch chemistry may be utilized to remove the polysilicon gate 37 to form an opening (i.e., recess) 38. The recess 38 has a bottom 40 and sidewalls 42 formed by the sidewall spacers 44.

Figure 10:
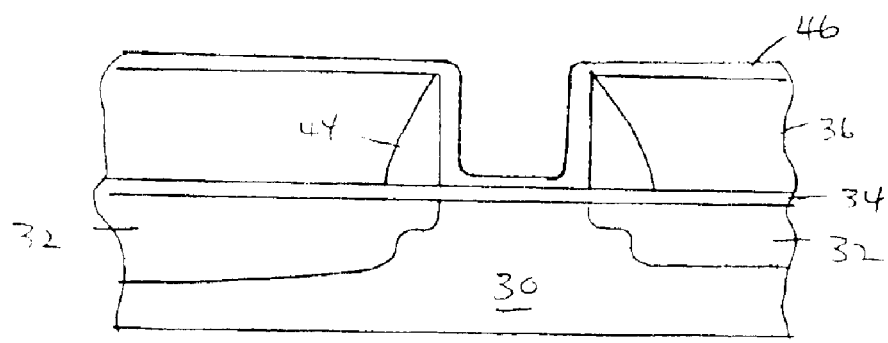
FIG. 10 depicts the portion of FIG. 9, after an oxide layer has been deposited, in accordance with embodiments of the present invention.

Subsequently, as depicted in FIG. 10, an oxide layer 46 is deposited within the recess 38 and on the dielectric layer 36. In preferred embodiments of the invention, the oxide layer 46 is an oxygen-rich oxide, formed by CVD, for example. The formation of an oxygen-rich oxide is well known to those of ordinary skill in the art, and typically involves lowering the temperature during deposition and/or adjusting the ratio of the silane to the oxygen being supplied to the deposition chamber. Increasing the oxygen and/or decreasing the silane increases the oxygen-richness of the oxide. The thickness of the CVD oxide layer 46 is between about 10 to about 50 Å, for example. The oxide layer 46 contacts the gate oxide 34 at the bottom of the recess 38.

Figure 11:
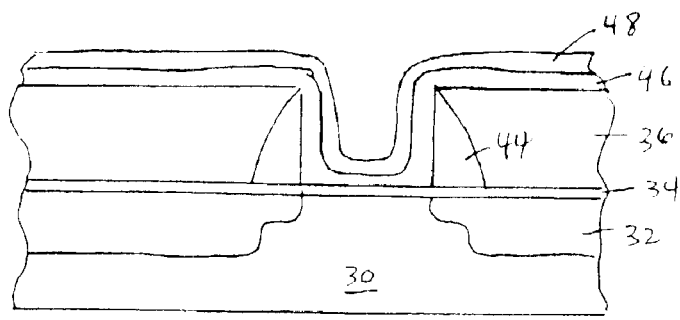
FIG. 11 shows the structure of FIG. 10, following the deposition of a metal layer on the oxide layer, in accordance with embodiments of the present invention.
Figure 12:
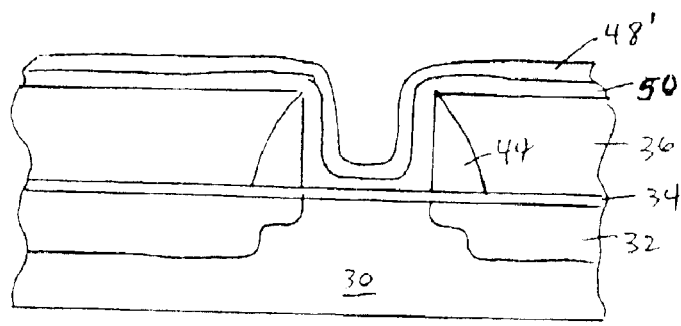
FIG. 12 depicts the structure of FIG. 11, following the formation of a high-k gate dielectric according to the process of the present invention.

FIG. 11 shows the structure of FIG. 10 following the deposition of a metal layer 48, such as tantalum (Ta). This Ta film is deposited by low-power physical vapor deposition (PVD), for example. The DC sputtering power for the low power PVD deposition technique is between about 300 watts to about 3000 watts in preferred embodiments of the present invention. A Ta film in the range of approximately 75 Å to approximately 150 Å is formed. In preferred embodiments, the thickness of the Ta film 48 is about 100 Å.

Following the formation of the Ta layer 48, the CVD oxide 46 is reacted with the Ta layer 48 by an annealing process. An annealing cycle at an elevated temperature of between about 200° C. to about 600° C. is performed. A particularly preferred temperature is approximately 350° C. for this process step. The annealing may be performed in an annealing ambient that is a vacuum or a forming gas, such as Ar, He, etc.

The elevated temperature anneal of the present invention transforms the lower portion of the Ta film and the CVD oxide 46 into high k $Ta_2O_5$. However, the upper portion of the original Ta film 48 remains metallic. This is represented by a portion of the Ta film 48 remaining Ta and provided with reference numeral 48', while a new $Ta_2O_5$ region 50 has been created within the damascene structure. The annealing may occur for approximately 1 to approximately 30 minutes in certain embodiments of the present invention.

This single process step provides a high k gate dielectric $Ta_2O_5$ that has less carbon than $Ta_2O_5$ films that are formed by CVD or ALD techniques. Hence, the final product will exhibit less leakage and greater thermal stability than products containing conventional $Ta_2O_5$ films.

Figure 13:
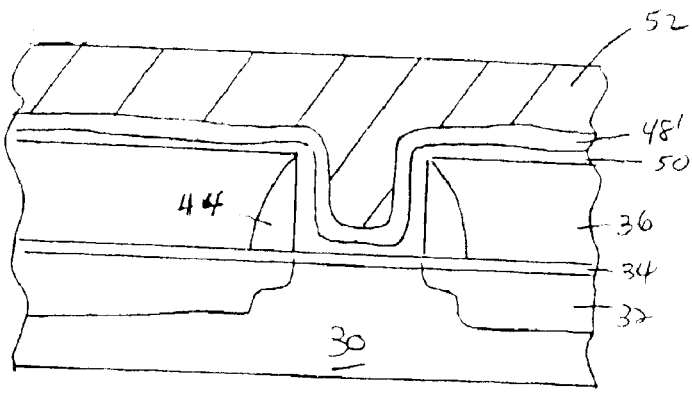
FIG. 13 shows the structure of FIG. 12, following the deposition of additional metal on the already deposited metal layer in accordance with embodiments of the present invention.

In FIG. 13, additional metal material 52 is deposited by conventional techniques over the tantalum layer 48'. This additional metal material 52 may be Ta or Cu, for example. The metal material 52 should be compatible with the metal gate material formed by the Ta layer 48'.

Figure 14:
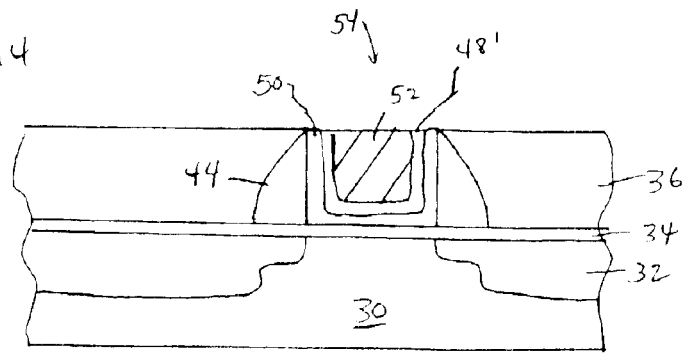
FIG. 14 depicts the structure of FIG. 13, following the planarization that forms the metal gate structure, in accordance with embodiments of the present invention.

In FIG. 14, the metal gate 54 has been formed by planarizing, such as by chemical mechanical polishing (CMP), for example. The metal gate 54 exhibits less leakage and has greater thermal stability, due to the lower carbon content of the high k gate dielectric material $Ta_2O_5$ formed in the manner described by the embodiments of the present invention.

Although the present invention has been described and illustrated in detailed, it is to be clearly understood that the same is by way of illustration and example only, and is not to be taken by way of limitation, the scope of the present invention being limited only by the terms of the appended claims.

What is claimed is:

1. A method of forming a semiconductor structure comprising the steps of:
    forming a precursor structure having a substrate with active regions separated by a channel, and a temporary gate over the channel and between dielectric structures;
    removing the temporary gate to form a recess with a bottom 40 and sidewalls between the dielectric structures;
    depositing oxide within the recess;
    depositing Ta by physical vapor deposition the oxide; and
    annealing to form a $Ta_2O_5$ region and a Ta region from the deposited oxide and Ta,
    wherein the annealing is performed at temperatures between about 200° C. to about 600° C.

2. The method of claim 1, wherein the precursor includes a gate oxide, and the step of depositing oxide includes depositing the oxide on the gate oxide.

3. The method of claim 2, further comprising depositing metal on the Ta region and planarizing to form a metal gate.

4. The method of claim 3, wherein the metal is Ta.

5. The method of claim 3, wherein the metal is Cu or a Cu alloy.

6. The method of claim 1, wherein the deposited oxide is an oxygen rich CVD oxide.

7. The method of claim 6, wherein the oxide is deposited to a thickness between about 10 Å to about 50 Å.

8. The method of claim 7, wherein the Ta is deposited to a thickness between about 75 Å to about 150 Å.

9. The method of claim 1, wherein the temperature is about 350° C.

10. The method of claim 1, wherein the annealing is performed in a vacuum.

11. The method of claim 1, wherein the annealing is performed in a forming gas.

12. A method of forming a metal gate and a gate dielectric of a semiconductor device, comprising the steps of:
    forming an oxide within a damascene recess;
    depositing Ta by physical vapor deposition on the oxide; and
    reacting the Ta with the oxide to form $Ta_2O_5$ and Ta regions,
    wherein the step of reacting includes annealing at a temperature of between about 200° C. to about 600° C. for between about 1 to about 30 minutes.

13. The method of claim 12, further comprising depositing a metal on the Ta region and planarizing to form a metal gate.

14. The method of claim 13, wherein the metal is at least one of Ta, Cu or a Cu alloy.

15. The method of claim 12, wherein the temperature is about 350° C.

16. The method of claim 12, wherein the damascene recess contains a gate oxide, and the oxide is an oxygen-rich oxide formed on the gate oxide to a thickness of between about 10 Å to about 50 Å by chemical vapor deposition.

17. The method of claim 16, wherein the Ta is deposited to a thickness of out 75 Å to about 150 Å.

18. The method of claim 17, wherein the thickness of the deposited Ta is about 100 Å.

* * * * *

UNITED STATES PATENT AND TRADEMARK OFFICE
CERTIFICATE OF CORRECTION

PATENT NO. : 6,893,910 B1
DATED : May 17, 2005
INVENTOR(S) : Christy Mei-Chu Woo et al.

It is certified that error appears in the above-identified patent and that said Letters Patent is hereby corrected as shown below:

Column 6,
Line 15, change "physical vapor deposition the oxide" to -- physical vapor deposition on the oxide --.

Signed and Sealed this

Twelfth Day of July, 2005

JON W. DUDAS
*Director of the United States Patent and Trademark Office*